United States Patent [19]
Nii et al.

[11] Patent Number: 5,471,420
[45] Date of Patent: Nov. 28, 1995

[54] MEMORY CELL ARRAY SEMICONDUCTOR INTEGRATED CIRCUIT DEVICE

[75] Inventors: Koji Nii; Hideshi Maeno, both of Itami, Japan

[73] Assignee: Mitsubishi Denki Kabushiki Kaisha, Tokyo, Japan

[21] Appl. No.: 202,823

[22] Filed: Feb. 28, 1994

[30] Foreign Application Priority Data

Mar. 1, 1993 [JP] Japan .................................. 5-039722

[51] Int. Cl.$^6$ .................................................. G11C 11/40
[52] U.S. Cl. .......................... 365/182; 365/154; 365/205
[58] Field of Search ..................................... 365/182, 154, 365/205, 174

[56] References Cited

U.S. PATENT DOCUMENTS

| | | | |
|---|---|---|---|
| 4,447,891 | 5/1984 | Kadota | 365/154 |
| 5,334,880 | 8/1994 | Abadeer et al. | 365/154 X |
| 5,379,260 | 1/1995 | McClure | 365/154 X |

FOREIGN PATENT DOCUMENTS

| | | |
|---|---|---|
| 0511401 | 11/1992 | European Pat. Off. . |
| 4110140 | 10/1991 | Germany . |
| 3263687 | 11/1991 | Japan . |
| 3280294 | 12/1991 | Japan . |

OTHER PUBLICATIONS

"Advanced Structured Arrays Combine High Density Memories With Channel–Free Logic Array" by T. Chan et al., IEEE 1987 Custom Integrated Circuits Conference; pp. 39–43 (see p. 42, FIG. 5).

Japanese patent application for Memory Cell Circuit on Semiconductor Integrated Circuit Device (no serial no.) by inventor Hideshi Maeno filed on Sep. 4, 1990.

Primary Examiner—Do Hyun Yoo
Attorney, Agent, or Firm—Christopher R. Pastel; Thomas R. Morrison

[57] ABSTRACT

Memory cells having a stable write operation are formed in an array on a CMOS gate array semiconductor substrate. Each memory cell includes mutually adjacent transistors from a first pair of complementary conductivity type MOS transistor rows. These transistors are used to form a flip-flop and first and second access gates. The memory cell further includes mutually adjacent MOS transistors from a second pair of complementary conductivity type MOS transistor rows. These transistors are used to form an inverter and a third access gate connected to the output of the inverter. The input of the inverter is connected to one end of the flip-flop. The inputs of the first and second access gates are connected to bit lines through which complementary data signals are applied. The gates of the first and second access gate transistors are connected to a write word line. The third access gate is connected to a readout signal providing bit line, and the gate of the third access gate MOS transistor is connected to a read word line.

8 Claims, 17 Drawing Sheets

MEMORY CELL ARRAY SEMICONDUCTOR INTEGRATED CIRCUIT DEVICE

This invention relates to a memory cell array fabricated in a semiconductor integrated circuit form and, more particularly, to a memory cell array fabricated in a CMOS gate array semiconductor integrated circuit form.

BACKGROUND OF THE INVENTION

A semiconductor integrated circuit which includes a plurality of parallel pairs of MOS transistor rows is known. Each pair includes a row of P-channel MOS transistors and a row of N-channel MOS transistors. In each row, a transistor shares its source/drain regions with its adjacent transistors so that the transistors in that row are connected in series. Applying a cut-off potential to the gate of one transistor in the row can disconnect two transistors adjacent thereto so that the row is divided into two.

An example of such conventional memory arrays formed by integrated circuits comprises memory cells, each including a flip-flop formed by first and second inverters connected in loop, a buffering third inverter connected to the flip-flop, and a read access gate connected to the third inverter. Each inverter is formed by a combination of P-channel and N-channel transistors. P-channel transistors are arranged in rows, and N-channel transistors are also arranged in rows.

Thus, each memory cell uses transistors in a pair of rows of P-channel and N-channel transistors. The first and second inverters are disposed adjacent to each other, and the third inverter is disposed with isolating transistors interposed between the first and second inverters, on one hand, and the third inverter, on the other. The write access gate is disposed adjacent to the first inverter, and the read access gate is disposed adjacent to the third inverter. A number of such memory cells are formed with transistors in each row pair, with isolating transistors interposed between adjacent memory cells.

Conventional memory cells of the described type are intended to receive either of "H" and "L" data applied from the write access gate to write the received data into the flip-flop. However, a problem may arise, when data "H" is written into the flip-flop which has data "L" stored therein. Under such a condition, sometimes the flip-flop will not invert and, therefore, data "H" is not written into it. Inversion of states of flip-flops can be facilitated, if three or more transistors are used to form each of the inverters of the flip-flops. However, even if such provision is made, if the write signal voltage is lower than the desired level, reliable writing cannot be done.

Accordingly, a first object of the present invention is to provide a memory cell circuit into which data can be written stably at a high speed.

The above-described conventional memory cell array arrangement needs isolating transistors disposed between the second and third inverters of each memory cell and between adjacent memory cells in the memory cell array, such that each memory cell requires a larger number of transistors. The number of transistors which each memory cell uses increases particularly when the inverters forming the flip-flop use three or more transistors in order to facilitate inversion of the flip-flop.

Therefore a second object of the present invention is to arrange the memory cells to require a small number of transistors so that the substrate surface can be utilized efficiently.

SUMMARY OF THE INVENTION

According to the present invention, a CMOS gate array semiconductor substrate is used, in which a plurality of P-channel MOS transistors and a plurality of N-channel transistors are successively arranged in respective rows which are adjacent to each other to form a pair. A plurality of such pairs are disposed on the substrate. Each MOS transistor in each row shares its source/drain region with transistors adjacent thereto in that row. A memory cell array comprises a number of memory cells arranged in rows and columns on the substrate.

Each memory cell comprises a flip-flop formed by connecting first and second inverters in a loop, first and second access gates connected to the respective ones of the two ends of the flip-flop, a third inverter having an input end coupled to one of the two ends of the flip-flop, and a third access gate coupled to the output end of the third inverter.

Each of the first and second inverters comprises a combination of P-channel and N-channel MOS transistors in a first pair of MOS transistor rows. First and second access gates are formed in the same MOS transistor row pair as the MOS transistors of the first and second inverters and are disposed adjacent to and on opposite sides of the flip-flop formed by the first and second inverters. The third inverter comprises a combination of P-channel and N-channel MOS transistors in a second pair of MOS transistor rows. A third access gate is formed in the same MOS transistor row pair as the third inverter and is disposed adjacent to the third inverter.

The first access gate comprises a MOS transistor having its drain coupled to one end of the flip-flop, its source coupled to a first bit line, and its gate coupled to a first word line.

The second access gate comprises a MOS transistor having its drain coupled to the other end of the flip-flop, its source coupled to a second bit line, and its gate coupled to the first word line.

The third access gate comprises a MOS transistor having its drain coupled to the output end of the third inverter, having its source coupled to a third bit line, and having its gate coupled to a second word line.

The first and second bit lines are used to supply write data in complementary forms, and the third bit line is used to send out stored data. The first, second and third bit lines are common to all memory cells in each memory cell row of the array. The first and second word lines are used to send a data write command and a data read command, respectively, to memory cells and are common to all memory cells in each memory cell column.

In operation, in order to write data in each memory cell, a signal is applied from the first word line to the first and second access gates to render the access gate MOS transistors conductive. At the same time, complementary write data are applied to the first and second bit lines. Thus, the one end of the flip-flop is forced to an "H" level, while the other end of the flip-flop is forced to an "L" level. Like this, in comparison with a prior art memory cell in which one bit line is used to write data, the operating margin can be wider, which enables more stable write operation.

For read operation, a signal is applied through the second word line to the third access gate to render the third access gate MOS transistor conductive so that data stored in the flip-flop can be read out through the third inverter and the third access gate to the third bit line.

Because the first MOS transistor row pair are used to form the first and second inverters and the first and second access gates only, there is no need to dispose an insulating transistor between the respective circuits. More specifically, with respect to the first and second inverters, the transistors constituting the inverters can be disposed adjacent to each other by sharing a source/drain region with each other. Further, MOS transistors constituting the first inverter and the second access gate share a source/drain region with each other so that they can be disposed adjacent to each other. The same is applicable to the second inverter and the first access gate.

Furthermore, with respect to adjacent memory cells in the same row, first access gates or second access gates of adjacent memory cells can be disposed adjacent to one another so that MOS transistors constituting such adjacent access gates can share one source/drain region. This can make it possible to avoid the use of an insulating MOS transistor between adjacent memory cells.

By arranging such that a large number of adjacent MOS transistors share source/drain regions, wiring can be simplified relative to connecting wires to respective source and drain regions of respective transistors.

DETAILED DESCRIPTION OF THE INVENTION

Figure 1:
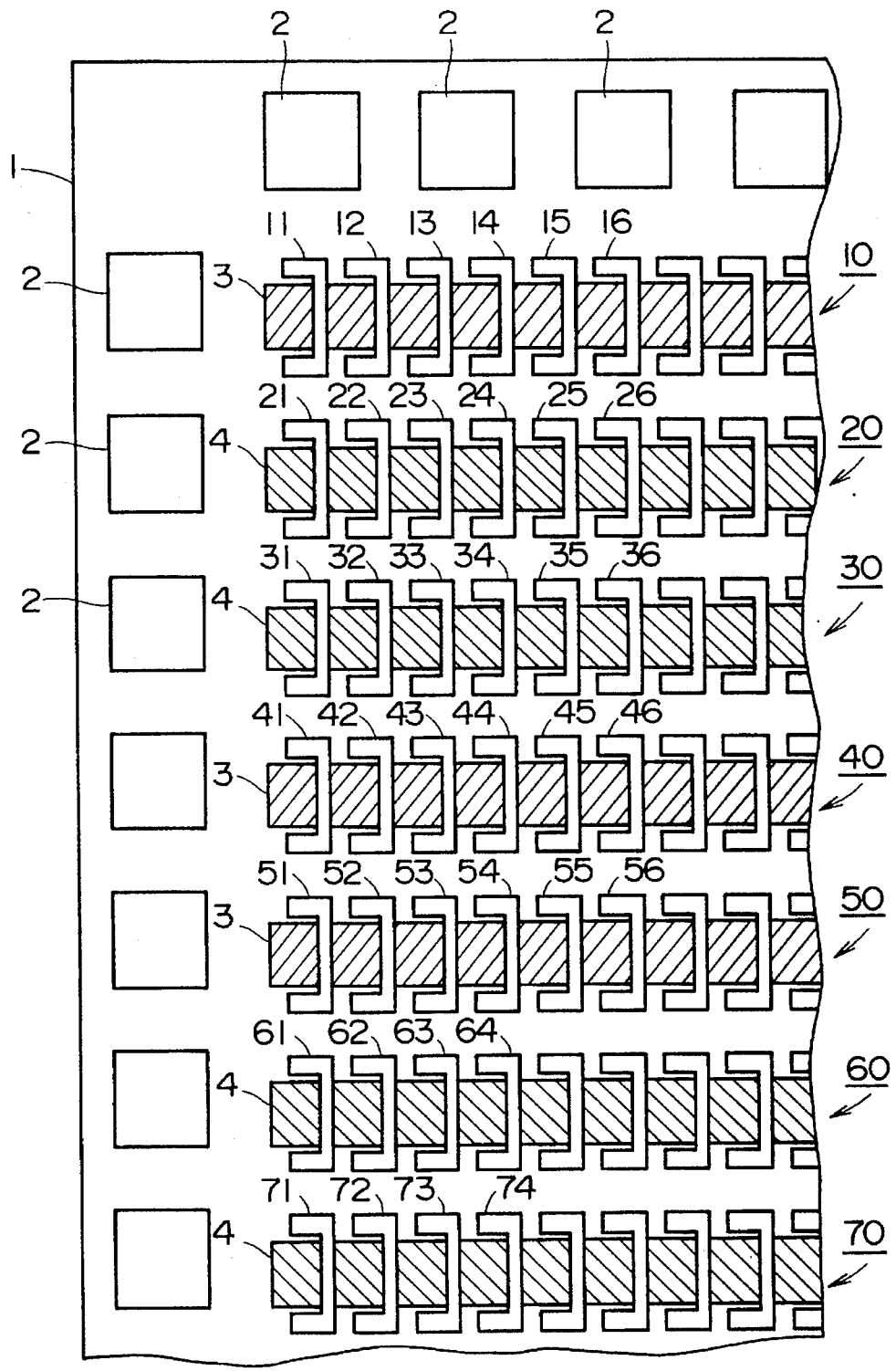
FIG. 1 is a plan view of a portion of an example of a CMOS gate array semiconductor substrate which is used for implementing the present invention.

FIG. 1 shows a CMOS gate array semiconductor substrate 1 which is known. On substrate 1, a number of input/output pads 2 are disposed along the periphery of substrate 1, and stripes of P-type regions 3 and N-type regions 4 are disposed in substrate 1 within the boundary defined by input/output pads 2. Gates 11, 12, 13, . . . , 21, 22, 23, . . . , 31, 32, 33, . . . , 41, 42, 43, . . . , are disposed on the respective regions, whereby MOS transistor rows 10, 20, 30, 40, . . . , are formed. Adjacent MOS transistors in adjacent rows form columns. In order to simplify the illustration, respective MOS transistors are referred to herein by reference numerals attached to their associated gates.

Figure 2:
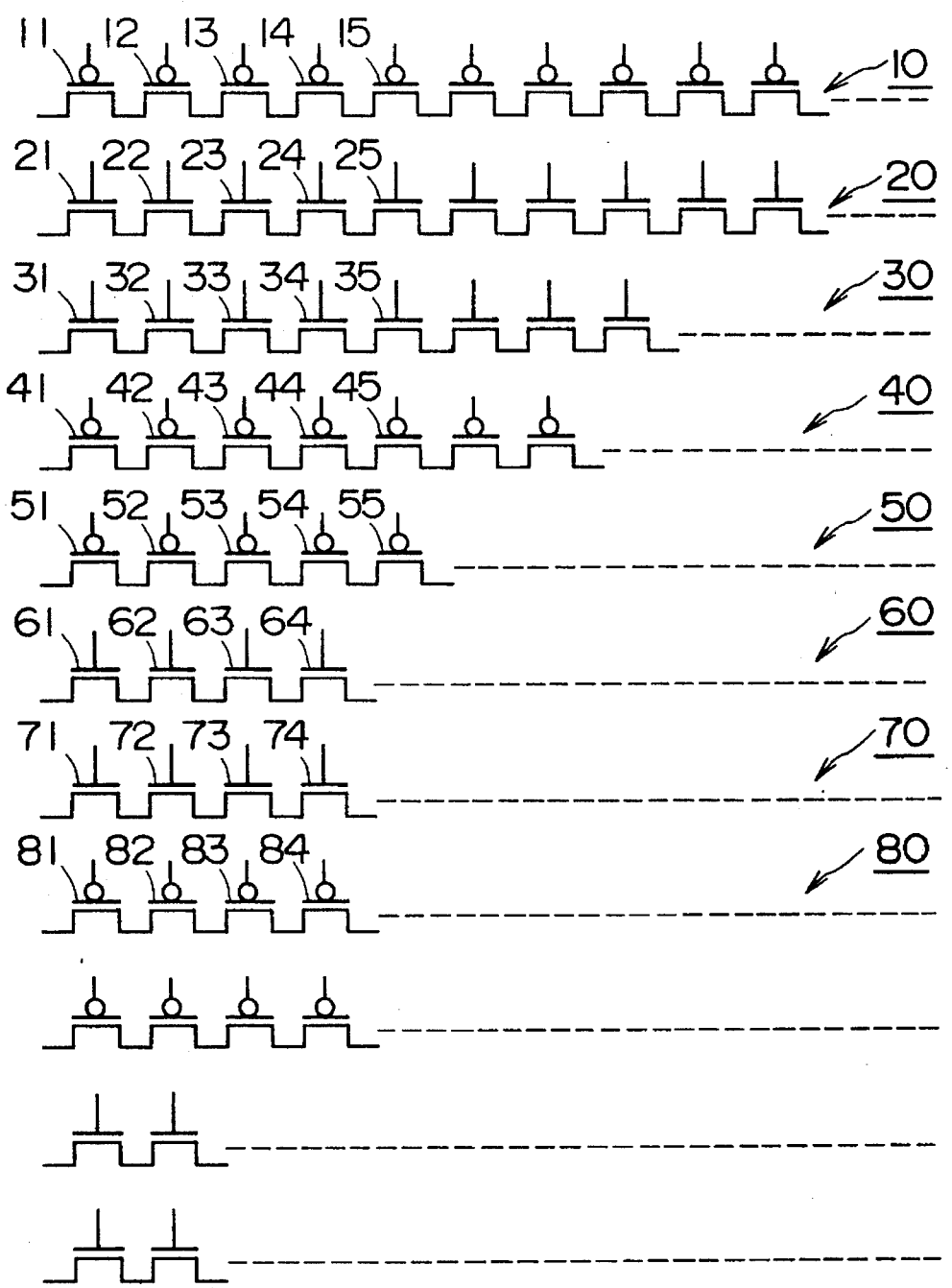
FIG. 2 is an equivalent circuit diagram of CMOS transistors on the substrate shown in FIG. 1.

Transistor rows 10, 20, 30, 40, . . . of the illustrated example may be represented by series connections of a number of MOS transistors as shown in FIG. 2. Transistor rows 10, 40 and 50 in FIG. 1 may be formed by P-channel MOS transistors, while transistor rows 20, 30, 60 and 70 may be formed by N-channel MOS transistors. Generally, the P-channel MOS transistor rows and N-channel MOS transistor rows are used in pairs. For example, P-channel MOS transistor row 10 and N-channel MOS transistor row 20 are used in a pair, P-channel MOS transistor row 30 and N-channel MOS transistor row 40 are used in a pair, and so forth.

As shown in FIGS. 1 and 2, each MOS transistor can use either one of the regions on the opposite sides of its gate as its source or drain. Accordingly, each region is expressed as a source/drain region. With a turn-off potential applied to the gate of a particular MOS transistor, the connection between two MOS transistors on opposite sides of that particular MOS transistor is broken so that that MOS transistor row is severed at that MOS transistor.

Figure 3:
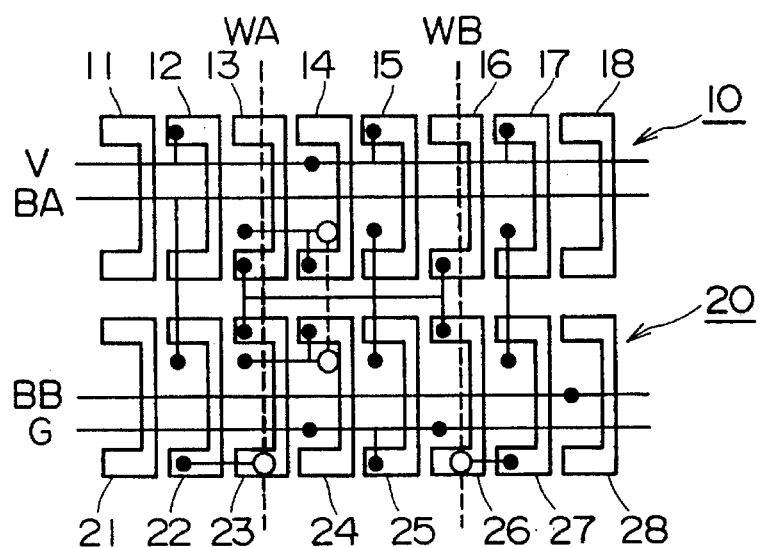
FIG. 3 Is a plan view of a conventional memory cell formed on the substrate shown in FIG. 1.

FIG. 3 shows an example of a conventional memory cell arranged on CMOS gate array semiconductor substrate 1. It should be noted that in the drawings, thick solid lines represent lower-layer wiring disposed on the substrate with an insulating layer interposed therebetween, black circles represent points where transistor electrodes are connected to the lower-layer wiring, thick broken lines represent upper-layer wiring disposed on the lower-layer wiring with an insulating layer disposed therebetween, and white circles represent points where the upper-layer wiring and the lower-layer wiring are connected each other.

Returning to FIG. 3, a bit line BA and a voltage supply line V are provided on MOS transistor row 10 by the lower-layer wiring, while a bit line BB and a ground line G are provided on MOS transistor row 20 by the lower-layer wiring. A write word line WA is provided by upper-layer wiring over a column of MOS transistors including MOS transistors 13 and 23, and a read word line WB is provided by upper-layer wiring over a column of MOS transistors including transistors 16 and 26.

Figure 4:
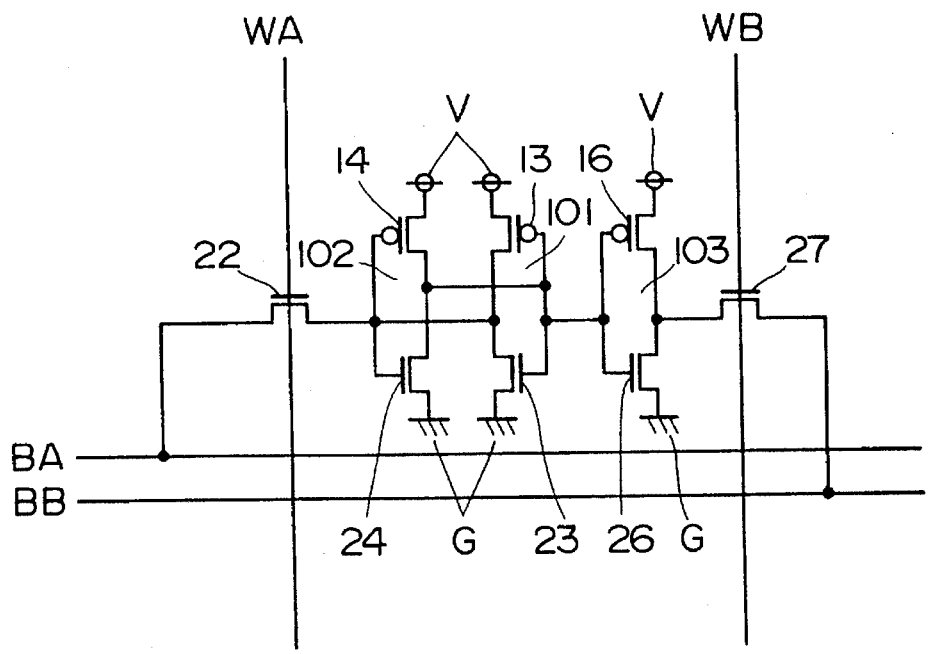
FIG. 4 is an equivalent circuit diagram of the memory cell shown in FIG. 3.

As shown in FIG. 4, P-channel MOS transistors 13, 14 and 16 have their sources connected to voltage supply line V their respective gates coupled to the respective gates of N-channel MOS transistors 23, 24 and 26, the sources of which are connected to ground line G. Also, the drains of P-channel MOS transistors 13, 14 and 16 are coupled to the drains of N-channel MOS transistors 23, 24 and 26. Thus, transistor pair 13, 23, transistor pair 14, 24, and transistor pair 16, 26 form inverters 101, 102 and 103, respectively. Input terminals of the respective inverters are provided at the junctions of the gates of the respective transistor pairs, and output terminals of the respective inverters are provided at the junctions of the drains of the respective transistor pairs.

A flip-flop is formed by connecting the input terminals of inverters 101 and 102 to the output terminals of inverters 102 and 101, respectively, so as to form a loop. A memory cell is completed by connecting one terminal of the flip-flop to the input terminal of inverter 103.

The memory cell of the described arrangement includes two access gates for data input/output. An N-channel MOS transistor 22 which provides one of the two access gates shares its drain with transistor 23 of the flip-flop, has its source connected to bit line BA, and has its gate connected to write word line WA, to thereby provide an input port. Similarly, an N-channel MOS transistor 27, which provides the other access gate, shares its drain region with transistor 26 of inverter 103, has its source connected to bit line BB, and has its gate connected to read word line WB, to thereby provide an output port.

The memory cell shown in FIGS. 3 and 4 operates in the following manner.

Data is written through the input port. By means of a write driver (not shown) connected to bit line BA, bit line BA is driven to the "L" level or "H" level depending on the value of data to be written in. Write word line WA is placed at the "H" level so that access gate transistor 22 is made conductive. Thus the input port of the memory cell storing data is electrically connected to bit line BA, and the value at the memory cell input port becomes equal to the value on bit line BA regardless of the value which the memory cell has stored therein. This completes the write operation.

After the completion of data writing, write word line WA is placed to the "L" level, which renders access gate transistor 22 non-conductive so that the written data value is stored in the memory cell. Since bit line BA is electrically disconnected from the memory cell, the retained data value in the memory cell does not change even when the value on bit line BA changes.

Data is read out through the memory cell output port. Placing word line WB at the "H" level causes access gate transistor 27 to become conductive so that the output port of the memory cell which is holding data is electrically connected to bit line BB. Thus, bit line BB assumes the value at the memory cell output port. A sense amplifier circuit (not shown) is connected to bit line BB. The sense amplifier determines whether the value on bit line BB is at "H" or "L". That is, readout operation is achieved.

Since data writing operation and data reading operation are performed through different independent ports, these two operations can be achieved simultaneously.

Figure 5:
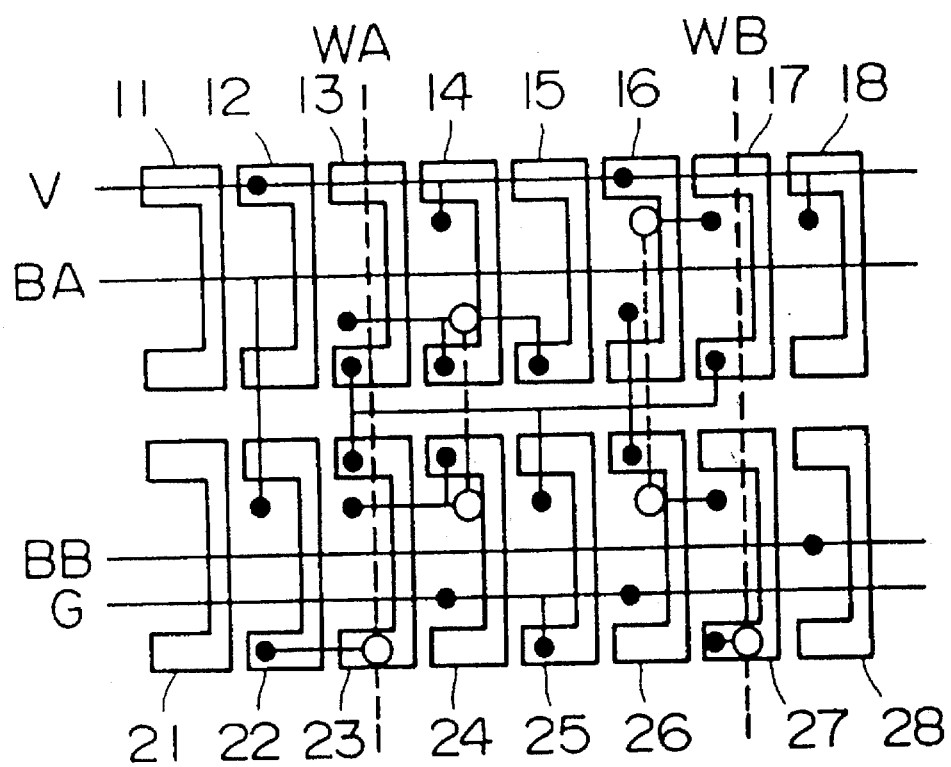
FIG. 5 is a plan view of another example of conventional memory cell formed on the substrate shown in FIG. 3.
Figure 6:
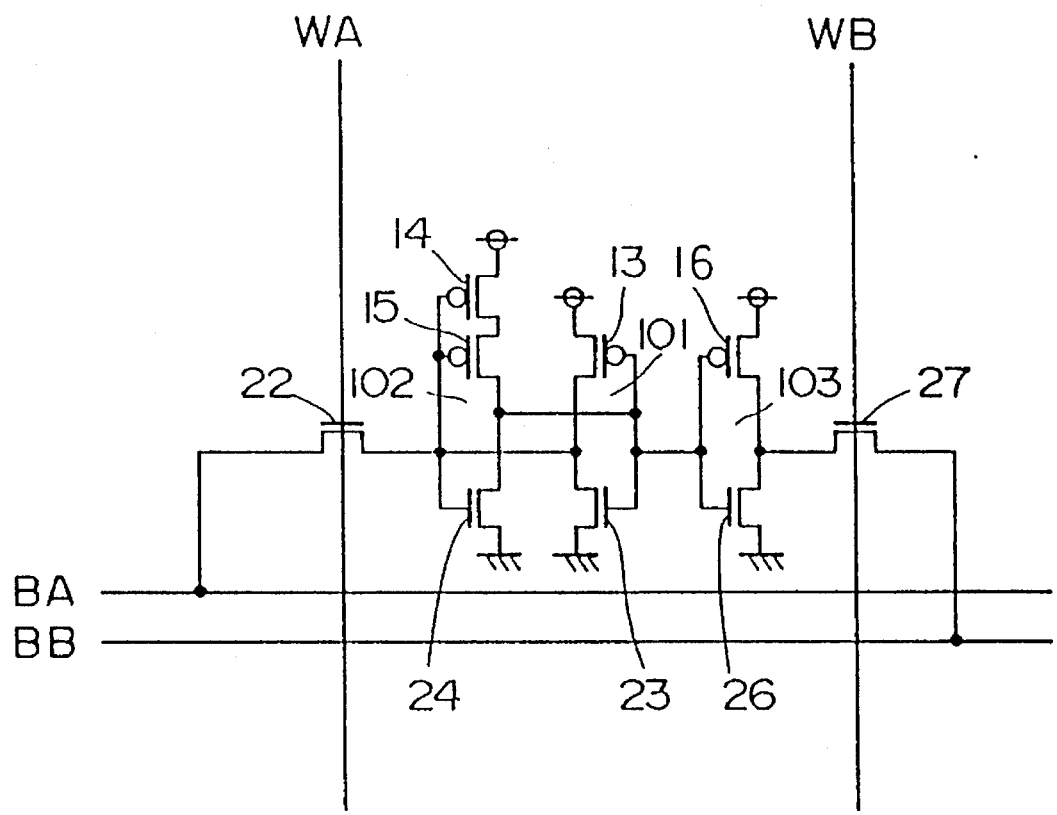
FIG. 6 is an equivalent circuit diagram of the memory cell shown in FIG. 5.

FIG. 5 shows another example of a conventional memory cell formed on the CMOS gate array semiconductor substrate shown in FIG. 1, and FIG. 6 shows its equivalent circuit. A major difference of the memory cell of FIGS. 5 and 6 from the memory cell of FIGS. 3 and 4 is a P-channel MOS transistor 15 connected in series with P-channel MOS transistor 14 of inverter 102.

The conventional memory cell shown in FIGS. 3 and 4 is arranged such that data of "H" or "L" level supplied through one bit line BA to the input port is written. However, since the input port access gate is provided by an N-channel MOS transistor, it cannot fully transmit data at the "H" level. Specifically, even when bit line BA is driven to the V supply voltage potential in order to write "H" level data, the input terminal of the flip-flop connected to bit line BA through the access gate cannot be driven fully to the V potential due to the "back gate effect". If the data which is currently stored in the memory cell is at the "L" level and the data to be written in is "H" data, it is sometimes impossible for the data in the memory cell to be inverted, and, therefore, the memory cell may fail to write correct data therein.

Writing of "H" level data is facilitated in the memory cell shown in FIGS. 5 and 6 by employing the series connection of P-channel MOS transistors 14 and 15 in inverter 102 which lowers the threshold voltage of inverter 102.

Specifically speaking, when word line WA is placed to the "H" level with bit line BA driven to the "H" level, bit line BA is electrically connected to the memory cell input port. If the data stored in the memory cell is "L" level data, an intermediate value tends to be assumed. However, since the threshold voltage of inverter 102 is low, the output of inverter 102 is readily inverted to provide the "L" level as an output. Consequently, the "L" level is applied as an input to inverter 101 so that its output, i.e. the input port of the memory cell is driven to the "H" level. This completes the write operation of the "H" level into the memory cell.

The data readout is performed in a similar manner as explained with respect to the prior art arrangement shown in FIG. 3.

However, it is not assured that data can always be written without fail, if, for example, the drive voltage on bit line BA is slightly lower than the nominal value, even though the threshold voltage of inverter 102 is lower.

As described above, conventional arrangements in which data is written into a memory cell through one bit line cannot have a sufficient margin for operation and, therefore, cannot achieve stable writing operation.

Further, as will be understood by comparing FIG. 3 with FIG. 4, and FIG. 5 with FIG. 6, one or more N-channel MOS transistors and one or more P-channel MOS transistors must be disposed between inverter 102 and inverter 103 for providing insulation therebetween. In addition, one or more N-channel MOS transistors and one or more P-channel MOS transistors, such as MOS transistors 15 and 25 in the case of the memory cell shown in FIGS. 3 and 4, and MOS transistors 16 and 25 in the case of the memory cell shown in FIGS. 5 and 6, must be disposed between adjacent memory cells for providing insulation therebetween. Thus, the substrate utilization efficiency is degraded.

The present invention has been made to solve the above-described problems. According to the present invention, a semiconductor integrated circuit device which includes memory cell circuits is provided. The memory cells are formed by efficiently utilizing elemental cells of a CMOS gate array on the semiconductor substrate and can operate stably at a high writing speed. The memory cell array of the present invention is now described with reference to some embodiments.

Figure 7:
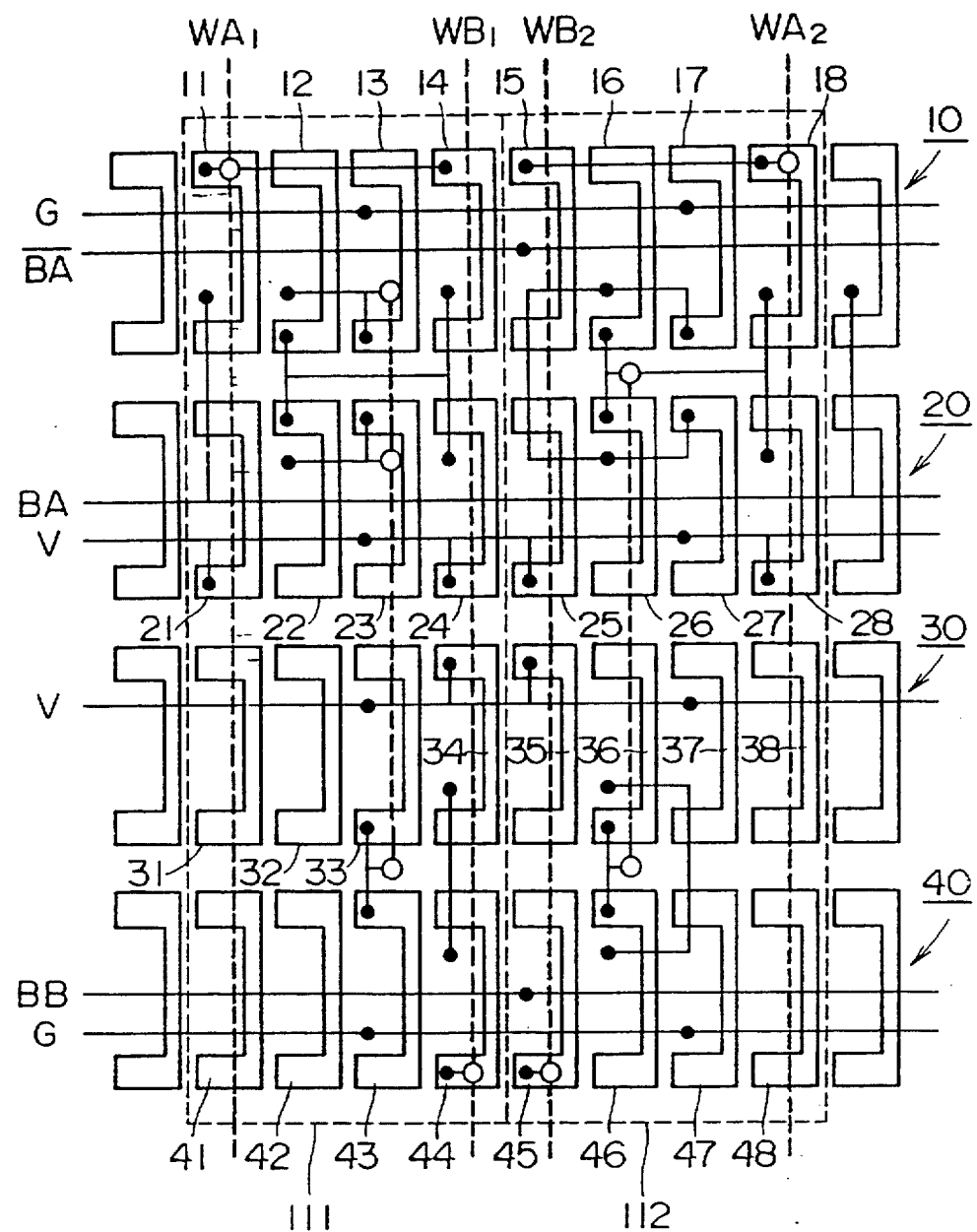
FIG. 7 is a plan view of a portion of a memory cell array according to an embodiment of the preferred invention.

Referring to FIG. 7 which shows a portion of a memory cell array according to a first embodiment of the present invention, an N-channel MOS transistor row 10 includes N-channel MOS transistors 11–18 which share their source/drain regions with adjacent transistors in that row, and an N-channel MOS transistor row 40 includes N-channel MOS transistors 41–48 which also share their source/drain regions with adjacent transistors in that row. Similarly, P-channel MOS transistor rows 20 and 30 include P-channel MOS transistors 21–28 and 31–38, respectively, which share their source/drain regions with adjacent MOS transistors in the respective rows. Rows 10 and 20 form a pair, and rows 30 and 40 form another pair.

A ground line G and a second bit line $\overline{BA}$ overlie row 10, a first bit line BA and a voltage supply line V overlie row 20, a voltage supply line V overlies row 30, and a third bit line BB and a ground line G overlie row 40. First word lines WA$_1$ and WA$_2$ are disposed to overlie a MOS transistor column including MOS transistors 11, 21, 31 and 41 and a MOS transistor column including MOS transistors 18, 28, 38 and 48, respectively. Similarly, second word lines WB$_1$ and WB$_2$ are disposed to overlie a MOS transistor column including MOS transistors 14, 24, 34 and 44, and a MOS transistor column including MOS transistors 15, 25, 35 and 45, respectively.

In FIG. 7, thick solid lines represent lower-layer wiring disposed over the MOS transistor array with an insulating layer interposed therebetween, and thick broken lines represent upper-layer wiring disposed over the lower-layer wiring with an insulating layer interposed therebetween. Black circles represent points where transistors electrodes are connected to the lower-layer wiring, and white circles represent point where the lower-layer wiring and the upper-layer wiring are connected to each other.

Each transistor shares source/drain regions with adjacent transistors in the same row, which means that their sources, their drains, or the source of one transistor and the drain of the other transistor are connected together. Thus, the integrated circuit shown in FIG. 7 is represented by a circuit diagram shown in FIG. 8.

Figure 8:
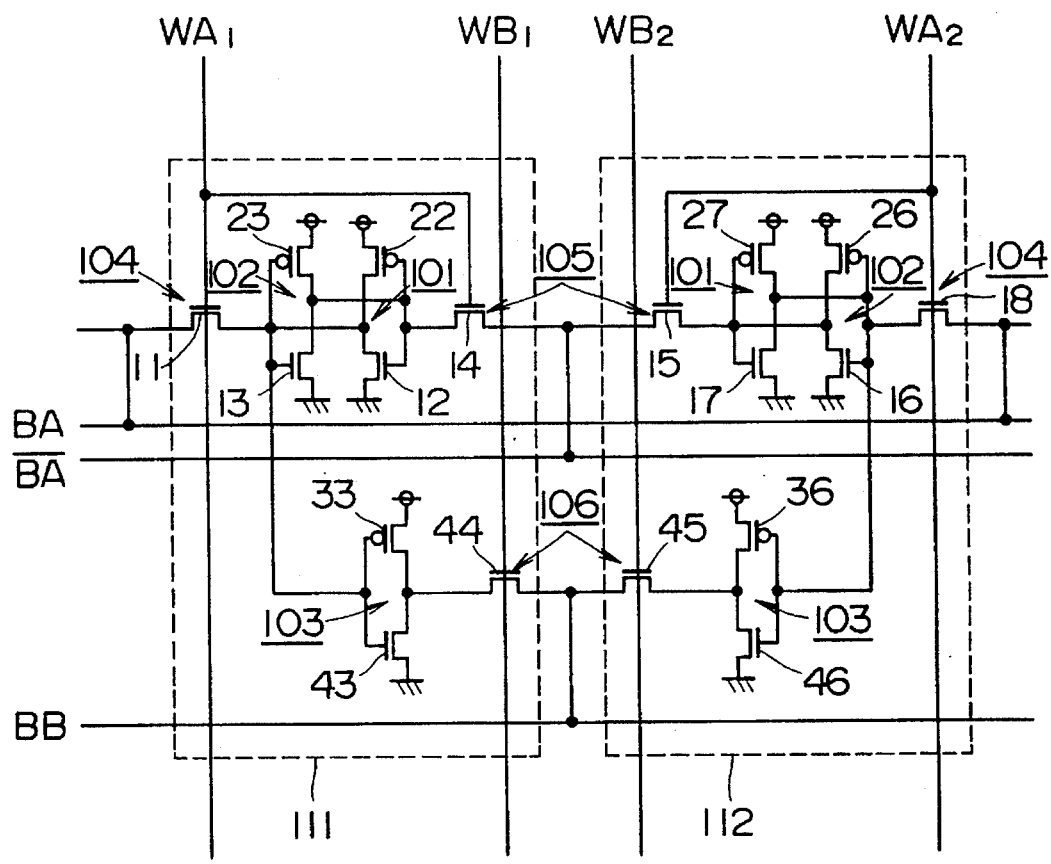
FIG. 8 is an equivalent circuit diagram of the portion of the array shown in FIG. 7.
Figure 8:
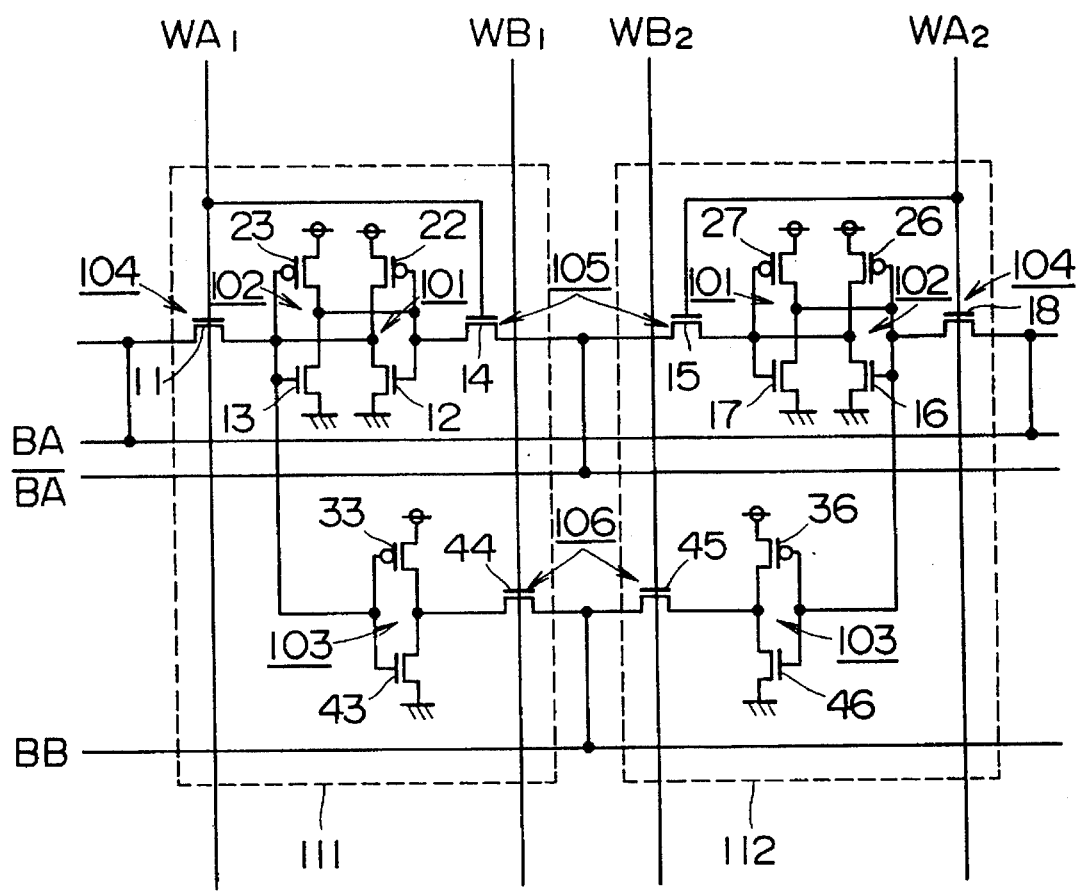

As shown in FIG. 8, N-channel MOS transistor 12 and P-channel MOS transistor 22 form a first inverter 101, N-channel MOS transistor 13 and P-channel MOS transistor 23 form a second inverter 102, and P-channel MOS transistor 33 and N-channel MOS transistor 43 form a third inverter 103. Inverters 101 and 102 are connected in loop to thereby form a flip-flop which has its two opposite ends connected respectively to first and second access gates 104 and 105. First and second access gates 104 and 105 comprise N-channel MOS transistors 11 and 14, respectively. Thus, inverters 101 and 102 and access gates 104 and 105 are formed of transistors in a pair of MOS transistor rows 10 and 20.

P-channel MOS transistor 33 and N-channel transistor 43 form third inverter 103 having its input end connected to the output end of inverter 101 and having its output end connected to a third access gate 106 which includes N-channel MOS transistor 44. Third inverter 103 and third access gate 106 are thus formed of MOS transistors from a pair of rows 30 and 40.

Thus, a memory cell 111 is formed of MOS transistors from MOS transistor rows 10, 20, 30 and 40.

Adjacent to memory cell 111, another memory cell 112 is disposed as shown. MOS transistors in memory cell 112 are disposed in symmetry with respect to the corresponding transistors of memory cell 111, as shown. Similarly, a number of memory cells are formed of MOS transistors from rows 10, 20, 30 and 40, with corresponding MOS transistors in adjacent memory cells symmetrically disposed with respect to each other. Furthermore, rows of similar memory cells are formed of MOS transistors from other rows, such as rows 50, 60, 70, 80, . . . (FIG. 1).

Data is written into memory cell 111 in the following manner. By means of a write driver (not shown) connected to bit lines BA and $\overline{BA}$, bit lines BA and $\overline{BA}$ are driven to assume complementary levels "H" and "L" or "L" and "H", respectively, depending on the value of data to be written into memory cell 111. In other words, when bit line BA is driven to the "L" level, bit line $\overline{BA}$ is driven to the "H" level, and vice versa. Thereafter, word line WA$_1$ is driven to the "H" level so that access gate MOS transistors 11 and 14 are rendered conductive. Thus, bit line BA is electrically connected to one end of the flip-flop which is storing data, while bit line $\overline{BA}$ is electrically connected to the other end of the flip-flop. Thus, the voltages at the two ends of the flip-flop become equal to the values on respective bit lines BA and $\overline{BA}$ regardless of the data value retained in the flip-flop. The writing operation has been thus completed.

After the writing operation is completed, word line WA$_1$ is driven to "L", which renders MOS transistors 11 and 14 of access gates 104 and 105 non-conductive, and the written data value is stored in the memory cell. Thereafter, even if values on bit lines BA and $\overline{BA}$ change, the data value stored in the flip-flop does not change, since both bit lines are electrically disconnected from the flip-flop.

The data is read out from memory cell 111 in the following manner. Word line WB$_1$ is driven to the "H" level to thereby render MOS transistor 44 of access gate 106 conductive so that the data stored in the flip-flop is coupled through inverter 103 to bit line BB. A sense amplifier circuit (not shown) is connected to bit line BB and senses whether the value on bit line BB is at the "H" level or "L" level, i.e. reads out the data. Then, word line WB$_1$ is returned to the "L" level to complete the readout operation.

In order to access memory cell 112, similar processes to the ones described with reference to memory cell 111 are followed. However, memory circuit 112 would use word lines WA$_2$ and WB$_2$ rather than WA$_1$ and WB$_1$ which are for memory cell 111.

Since data reading and writing operations for each memory cell are performed through different independent access gates, the two operations can take place simultaneously with each other.

Now, the relationship among N-channel MOS transistors 11, 12, 13 and 14 in transistor row 10 is considered. As shown in FIG. 8, the drain of transistor 11 of first access gate 104 is connected to the drain of transistor 12 of first inverter 101. The source of transistor 13 of second inverter 102, as well as the source of transistor 12 of first inverter 101, is grounded. The drain of transistor 14 of second access gate 105 is connected to the drain of transistor 13 of second inverter 102.

Like this, N-channel MOS transistors 11, 12, 13 and 14 are connected in series, which enables them to share source/drain regions with adjacent transistors, as shown in FIG. 7. Thus, there is no need to interpose another N-channel MOS transistor for the purpose of isolation, and wiring between transistors can be simplified.

Next, the relationship between adjacent memory cells 111 and 112 is considered. The sources of N-channel MOS transistors 14 and 15 of second access gates 105 of respective memory cells 111 and 112 are both connected to bit line $\overline{BA}$. The sources of N-channel MOS transistors 11 and 18 of first access gates 104 are connected together with the sources of N-channel MOS transistors of first access gates 104 of respective adjacent memory cells to bit line BA. Also, the source of transistors 44 and 45 of third access gates 106 of respective memory cells are connected to common bit line BB. Thus, as shown in FIG. 7, the respective transistors can share source/drain regions with adjacent transistor so that there is no need for interposing an isolating transistor therebetween. The described relationship exists for all of adjacent memory cells in the same memory cell row.

Figure 9:
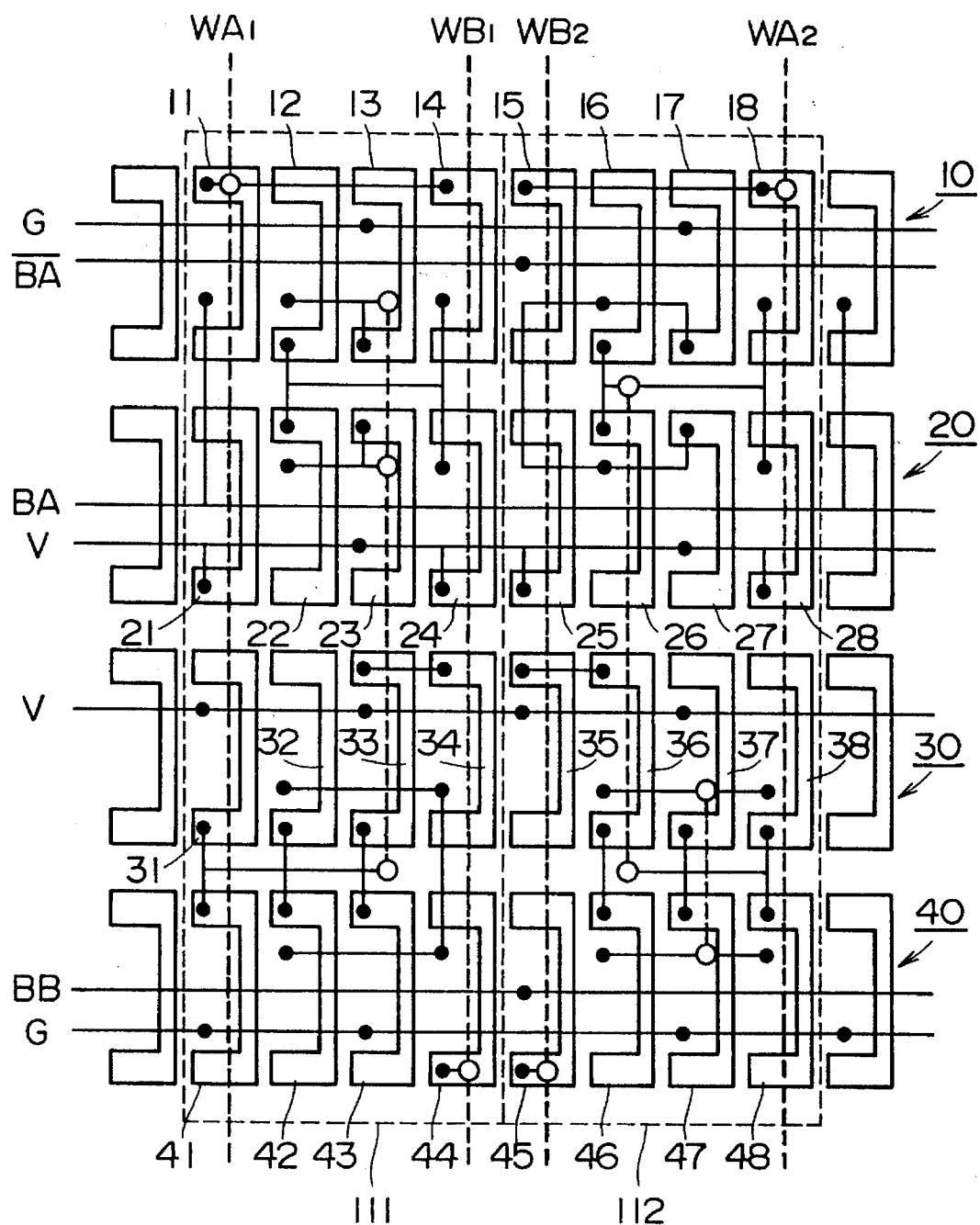
FIG. 9 is a plan view of a portion of a memory cell array according to a second embodiment of the present invention.
Figure 10:
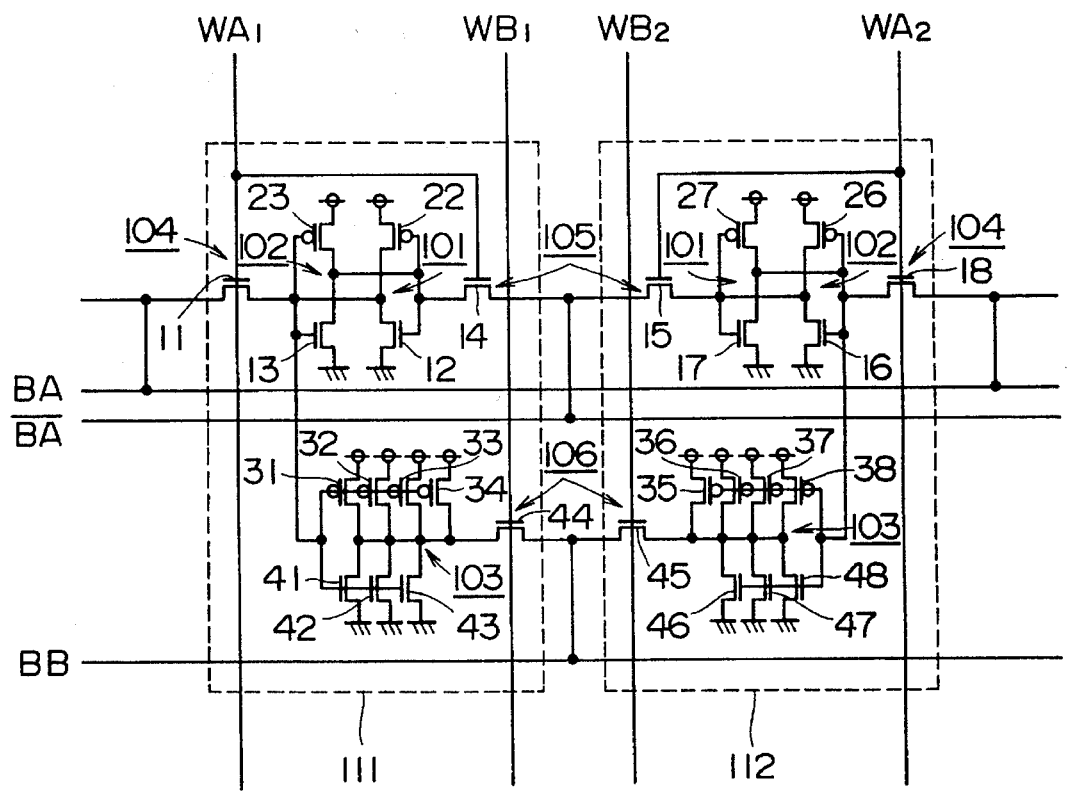
FIG. 10 is an equivalent circuit diagram of the portion of the array shown in FIG. 9.

The memory cell shown in FIG. 9 is similar to the memory cell shown in FIG. 7, except that, in each of third inverters 103 of memory cells 111 and 112, a parallel combination of four P-channel MOS transistors 31, 32, 33 and 34 is substituted for the single P-channel MOS transistor 33 of the memory cell of FIG. 7, and a parallel combination of three N-channel MOS transistors 41, 42 and 43 is substituted for the single N-channel MOS transistor 43 of the memory cell of FIG. 7. FIG. 10 shows its equivalent circuit.

The operation of the memory cells shown in FIGS. 9 and 10 is similar to that of the memory cells shown in FIGS. 7 and 8. However, since each third inverter 103 comprises a parallel combination of a plurality of P-channel MOS transistor and a parallel combination of a plurality of N-channel transistors, its driving ability is improved without increasing the area the memory cell occupies. This structure enables the reduction of time required for reading stored data, because, when access gate 44 is rendered conductive, each inverter 103 strongly drives bit line BB to place it at the value equal to that of the stored data.

Figure 11:
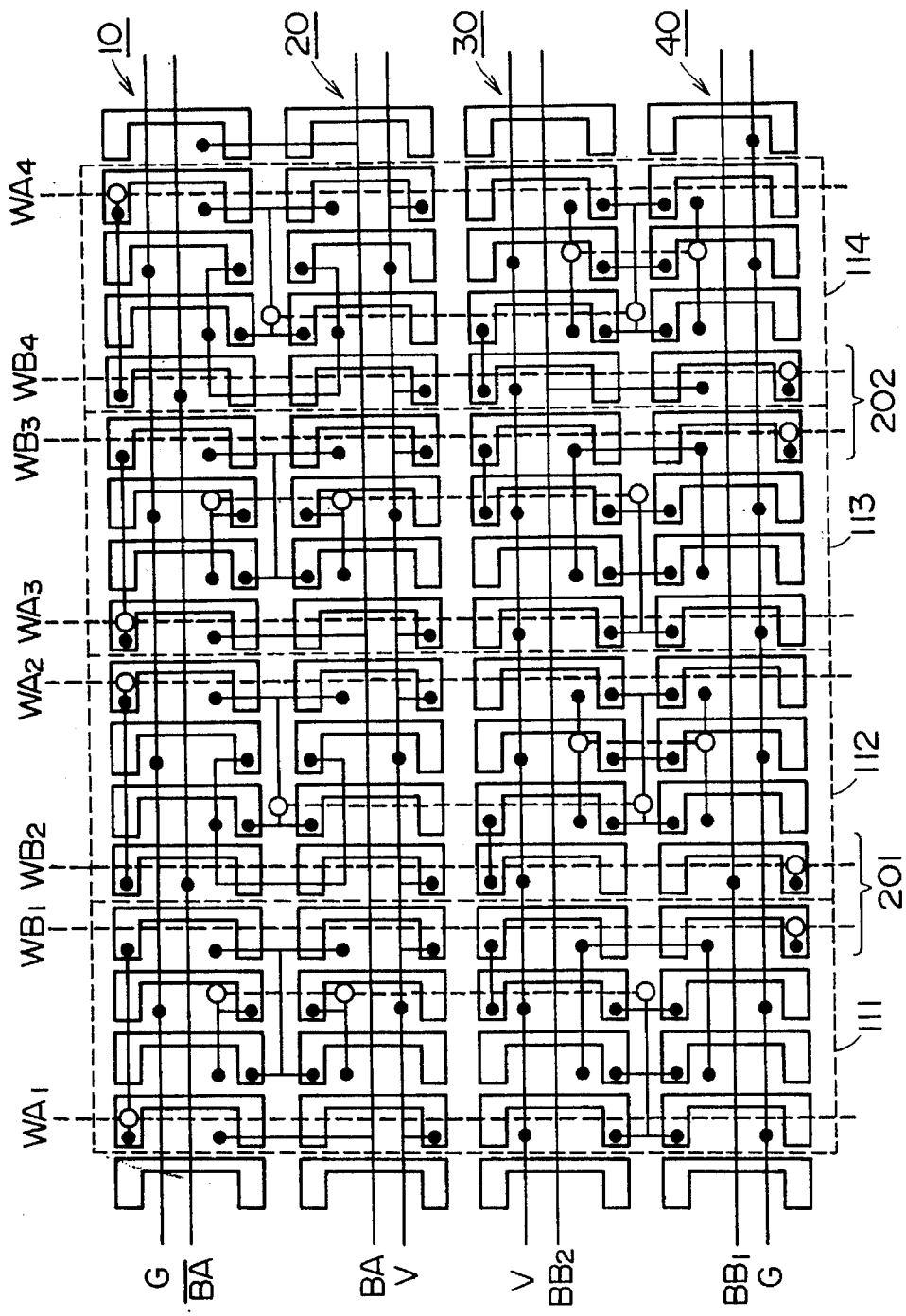
FIG. 11 is a plan view of a portion of a memory cell array according to a third embodiment of the present invention.
Figure 12:
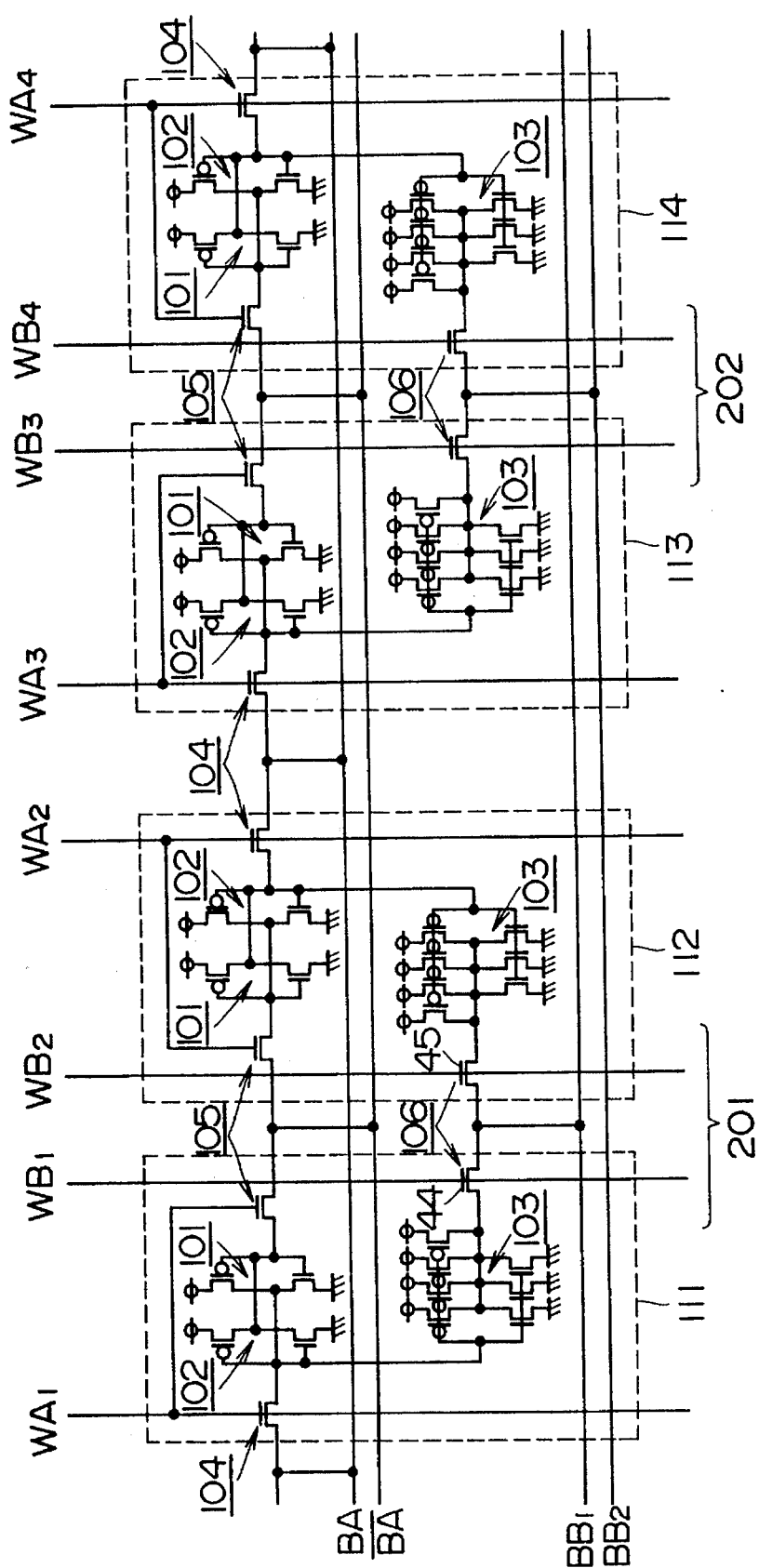
FIG. 12 is an equivalent circuit diagram of the portion of the array shown in FIG. 11.

FIG. 11 shows a memory cell array including a memory cell pair 201 comprising symmetrically disposed memory cells 111 and 112 of FIG. 9, and a similar memory cell pair 202 disposed adjacent to memory cell pair 201 in the row direction. Memory cell pair 202 comprises memory cells 113 and 114. In FIG. 12, an equivalent circuit is shown.

In FIG. 11, $WA_1$, $WA_2$, $WA_3$ and $WA_4$, and $WB_1$, $WB_2$, $WB_3$ and $WB_4$ represent first and second word lines for each memory cell column in the memory cell array. BA and $\overline{BA}$ represent first and second bit lines for each memory cell row, and $BB_1$ and $BB_2$ are third bit lines. Other reference numerals represent similar components or functions to corresponding ones shown in FIG. 9 having the same reference numerals.

In FIG. 12, third access gates 106 of memory cells 111 and 112 of the odd-numbered memory cell pairs, such as memory cell pair 201, are connected to bit line $BB_1$, whereas third access gates 106 of memory cells 113 and 114 of the even-numbered memory cell pairs, such as a pair 202, are connected to bit line $BB_2$. First access gates 104 and second access gates 105 of respective memory cells 111–114 are connected respectively to common bit line BA and common bit line $\overline{BA}$.

The operation of each memory cell is similar to that of each memory cell shown in FIG. 9. However, for reading data from memory cells 111, 112 in each of the odd-numbered memory cell pairs, bit line $BB_1$ is used, while bit line $BB_2$ is used for reading data from memory cells 113, 114 of each even-numbered memory cell pair.

With this arrangement, the number of the access gates connected to bit lines $BB_1$ and $BB_2$ is reduced to one-half, so that the parasitic capacitance associated with diffusion regions which provides load on bit lines $BB_1$ and $BB_2$ can be reduced. This, in turn, reduces the read access time relative to the memory cell array shown in FIG. 9.

Figure 13:
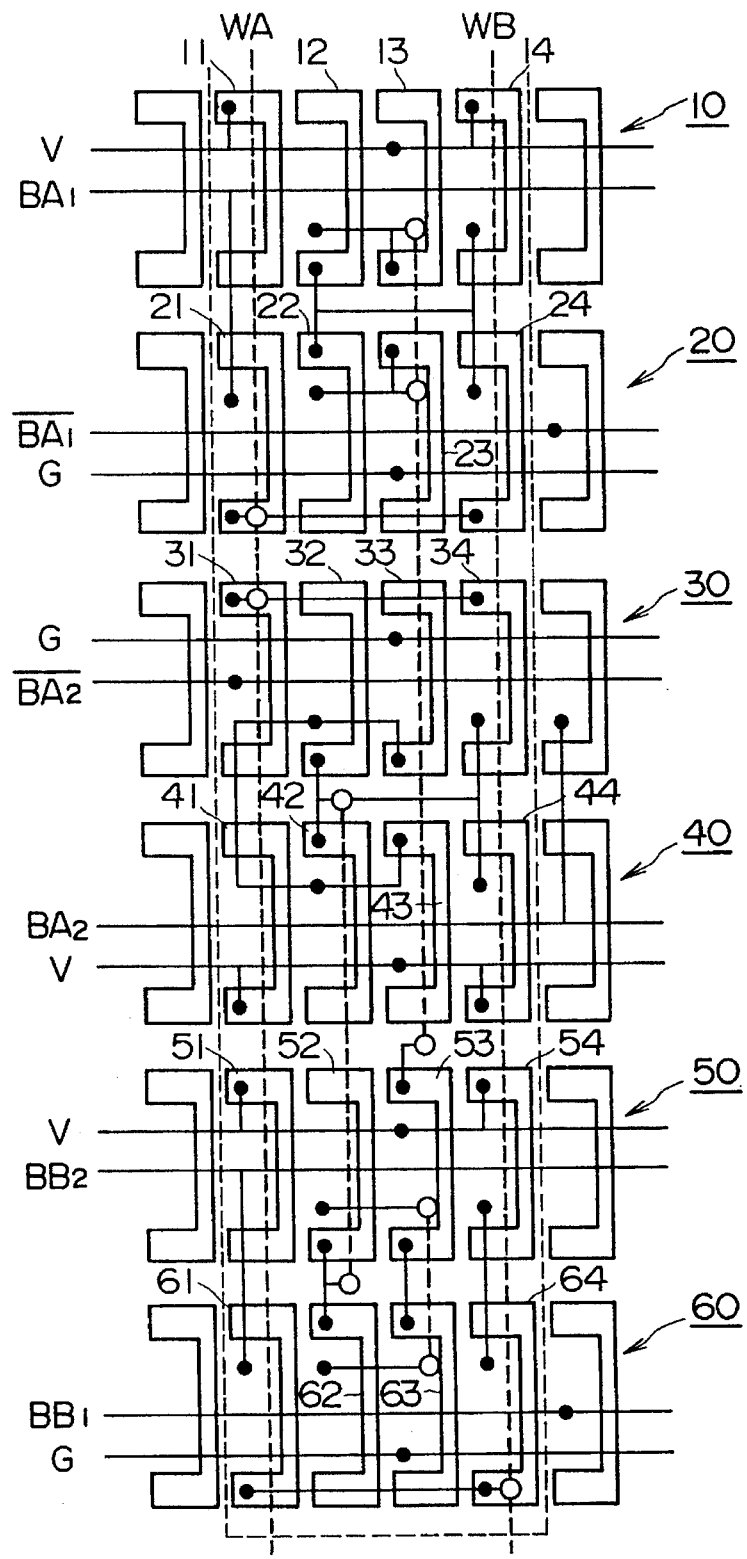
FIG. 13 is a plan view of a portion of a memory cell array according to a fourth embodiment of the present invention.
Figure 14:
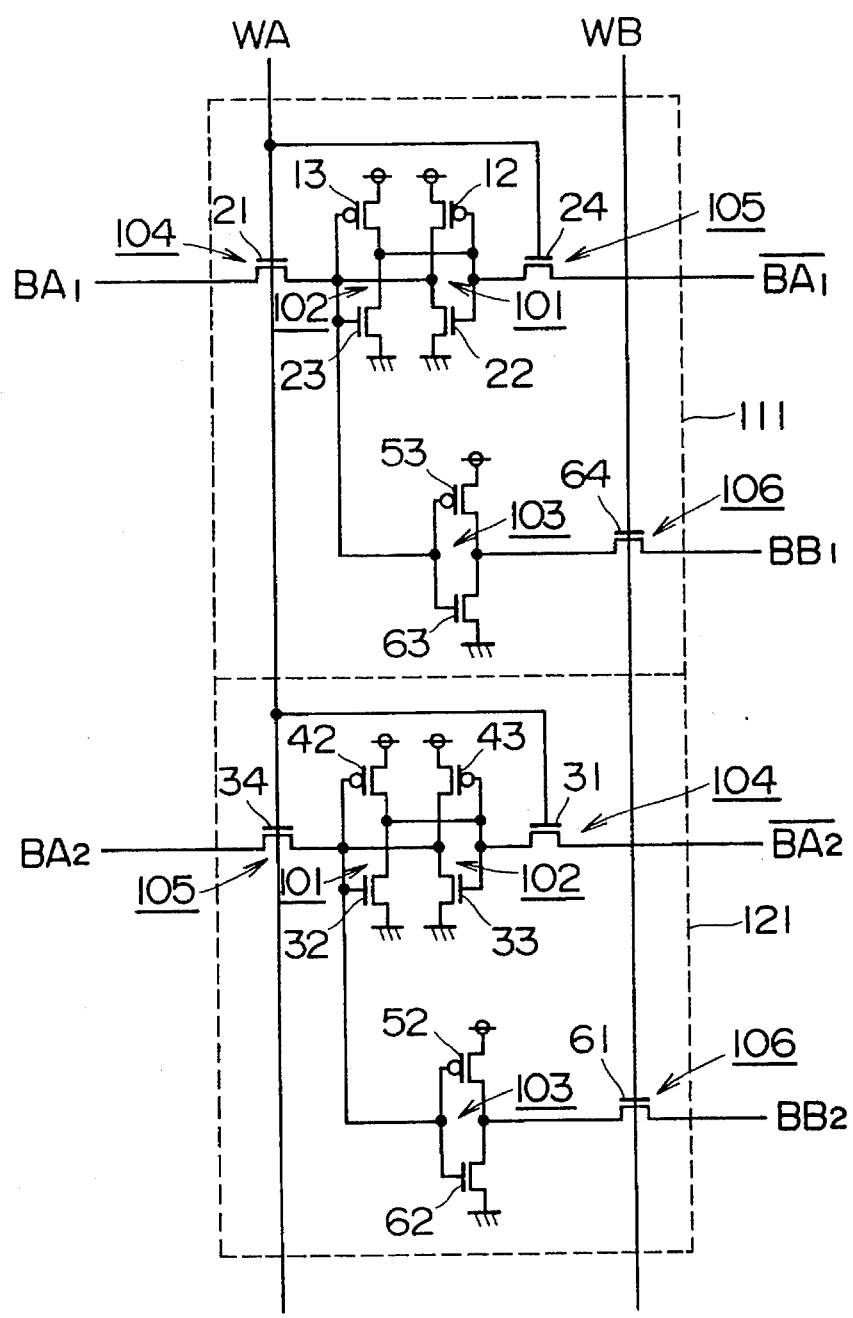
FIG. 14 is an equivalent circuit diagram of the portion of the array shown in FIG. 13.

Now, the embodiment shown in FIGS. 13 and 14 is discussed. It will become clear by contrasting the illustration in FIG. 13 to the illustration in FIG. 14, that similar to rows 10 and 20 shown in FIG. 7, inverters 101 and 102 and access gates 104 and 105, which are part of memory cell 111, are formed of MOS transistors from MOS transistor rows 10 and 20. Inverters 101 and 102 are formed of MOS transistors 12, 22, and MOS transistors 13, 23, respectively, and access gates 104 and 105 comprise MOS transistors 21 and 24, respectively.

Similarly, inverters 101 and 102 and access gates 104 and 105, which are part of a memory cell 121, are formed of transistors from MOS transistor rows 30 and 40. Inverters 101 and 102 are formed of MOS transistors 32, 42, and MOS transistors 33, 43, respectively, and access gates 104 and 105 comprise MOS transistors 31 and 44, respectively.

Inverter 103 and access gate 106 forming the remaining part of memory cell 111 and inverter 103 and access gate 106 forming the remaining part of memory cell 121 are formed of MOS transistors from transistor rows 50 and 60. Inverter 103 and access gate 106 of memory cell 111 comprise MOS transistors 53 and 63 and a MOS transistor 64, respectively, and inverter 103 and access gate 106 of memory cell 121 comprise MOS transistors 52 and 62 and a MOS transistor 61, respectively.

Word lines WA and WB extending in the column direction are disposed common to memory cells 111 and 121. For memory cell 111, bit lines $BA_1$, $\overline{BA_1}$ and $BB_1$ are disposed to overlie transistor rows 10, 20 and 60, respectively, and for memory cell 121, bit lines $BA_2$, $\overline{BA_2}$ and $BB_2$ are disposed to overlie transistor rows 30, 40 and 50, respectively. The operation of each memory cell is the same as that of memory cell 111 shown in FIG. 7.

As is understood from FIG. 14 showing an equivalent circuit of the memory cell array of FIG. 13, both of P-channel MOS transistors 53 and 52 of third inverters 103 of respective memory cells 111 and 121 are connected to voltage supply line V, and both of N-channel MOS transistors 63 and 62 of third inverters 103 of respective memory cells 111 and 121 are connected to ground line G. Accordingly, the source/drain region common to P-channel MOS transistors 52 and 53 can be connected to voltage supply line V, and the source/drain region common to N-channel MOS transistors 62 and 63 can be connected to ground line G. Thus, part of each of memory cells 111 and 121 can be formed on transistors row 50 and 60, and there is no need for using any isolating transistors therebetween. Like this, by forming two memory cells from six transistor rows, the area each memory cell occupies on the semiconductor substrate can be reduced significantly.

Figure 15:
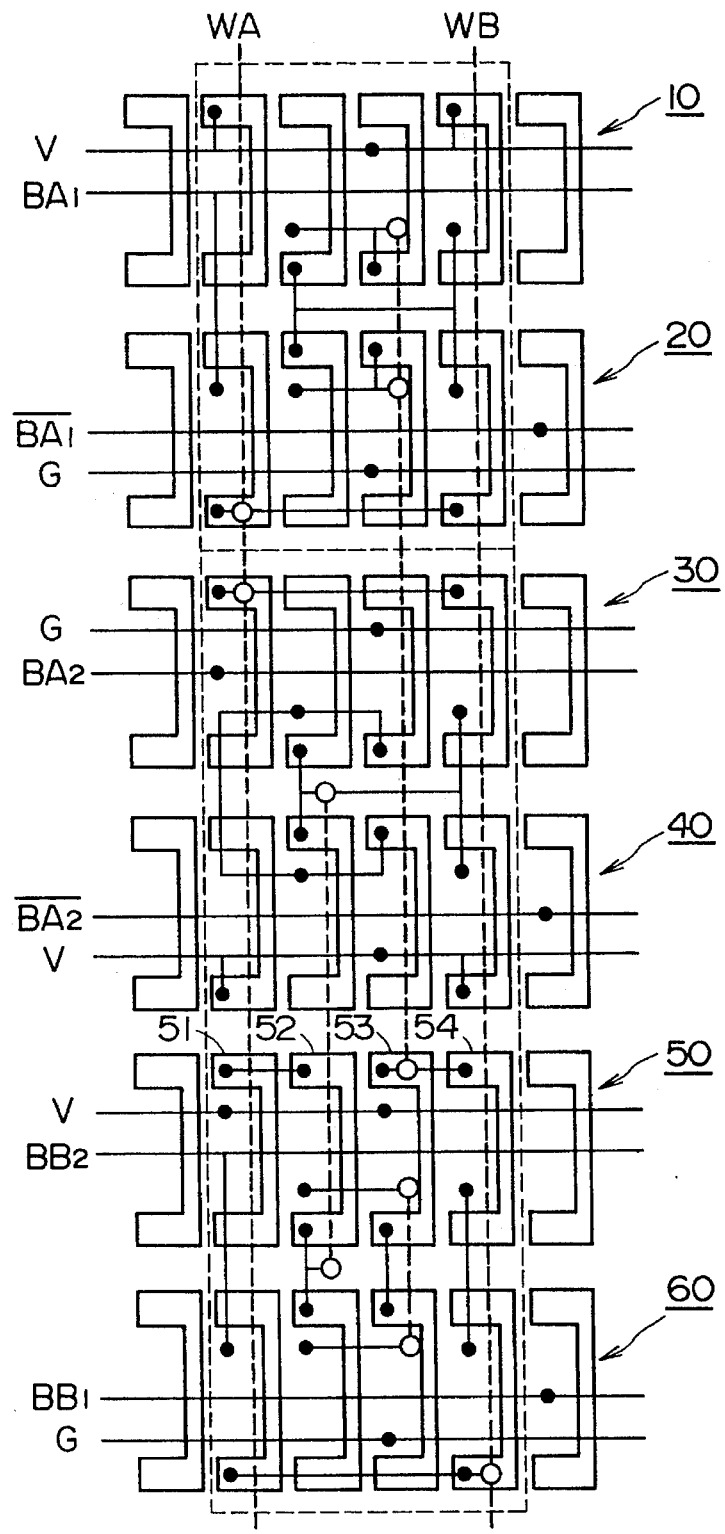
FIG. 15 is a plan view of a portion of a memory cell array according to a fifth embodiment of the present invention.
Figure 16:
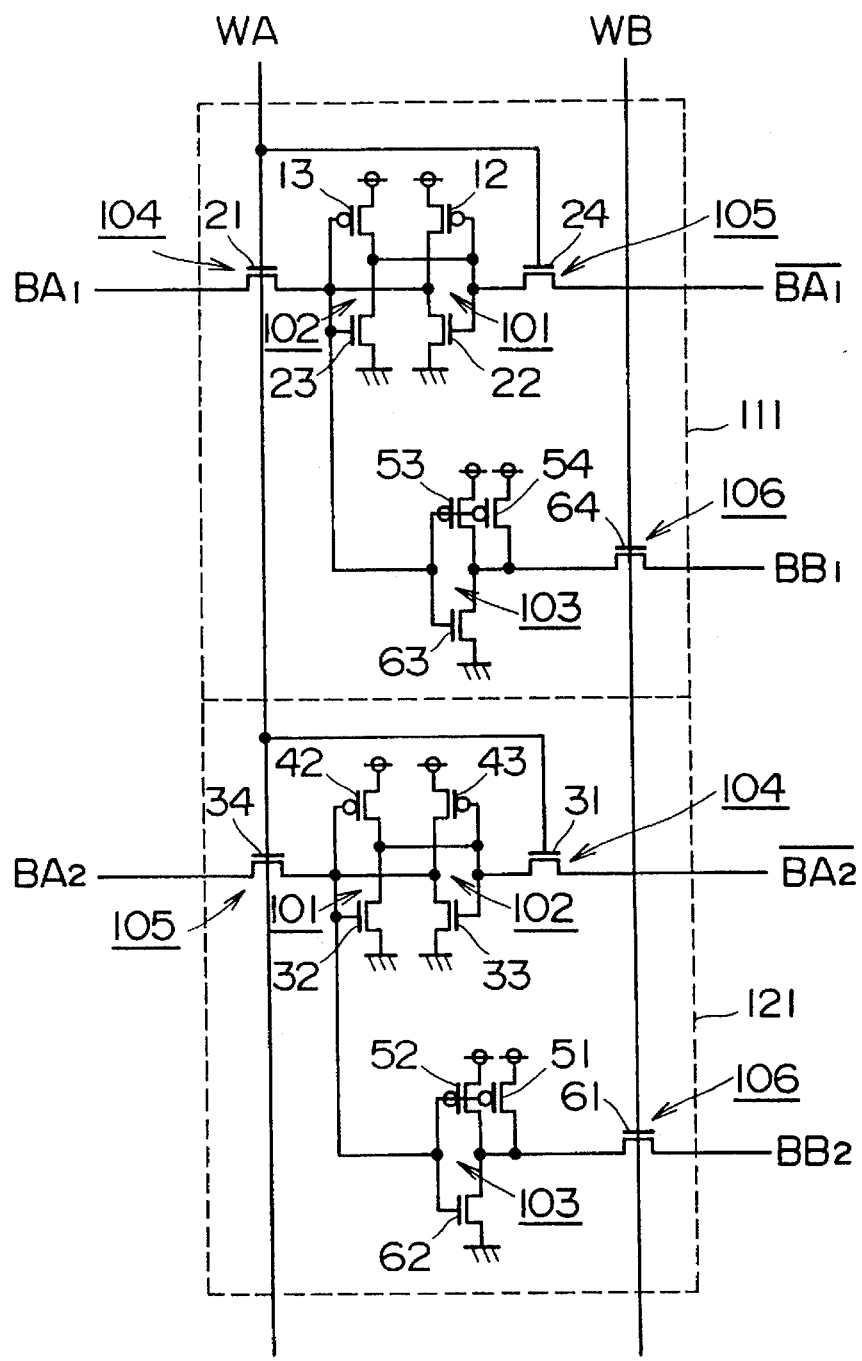
FIG. 16 is an equivalent circuit diagram of the portion of the array shown in FIG. 15.

FIG. 15 shows another embodiment. P-channel MOS transistors 51 and 54 in transistor row 50 which are not used in the embodiment shown in FIG. 13 are connected in parallel with respective adjacent transistors 52 and 53. The equivalent circuit of the arrangement shown in FIG. 15 is shown in FIG. 16. Since transistors 51 and 54 on opposite sides of memory cell pair 111, 121 have their sources connected to voltage supply line V, they can share a source/drain region with similar transistors in memory cells respectively adjacent in the row direction to memory cells 111 and 121, so that there is no need to dispose an isolating transistor.

The operations of the respective memory cells are similar to those of the memory cells shown in FIG. 13. However, due to the use of a parallel combination of plural P-channel MOS transistors for each third inverter 103, the driving ability of third inverter 103 is increased so that the access time can be reduced.

Figure 17:
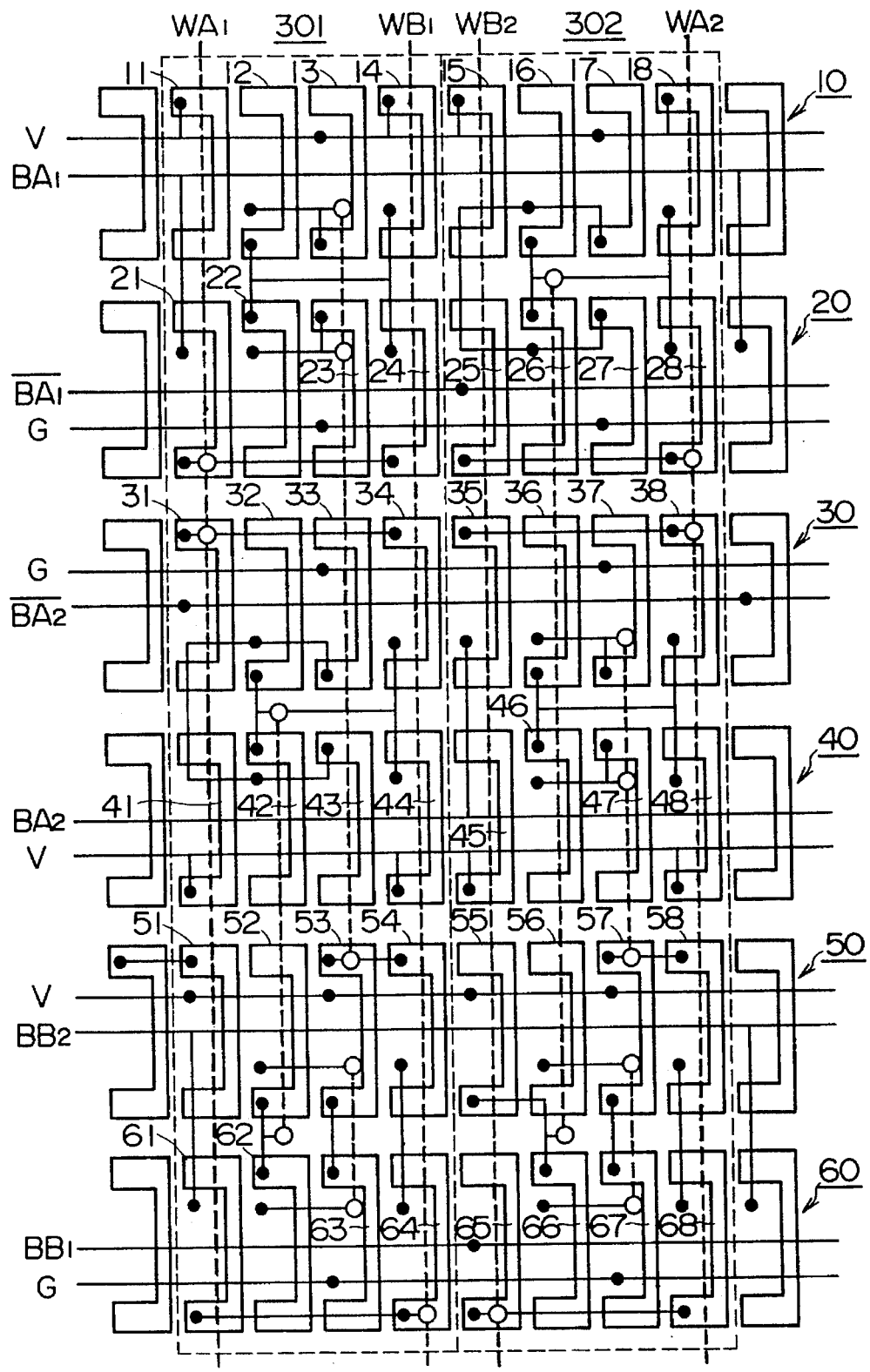
FIG. 17 is a plan view of a portion of a memory cell array according to a sixth embodiment of the present invention.
Figure 18:
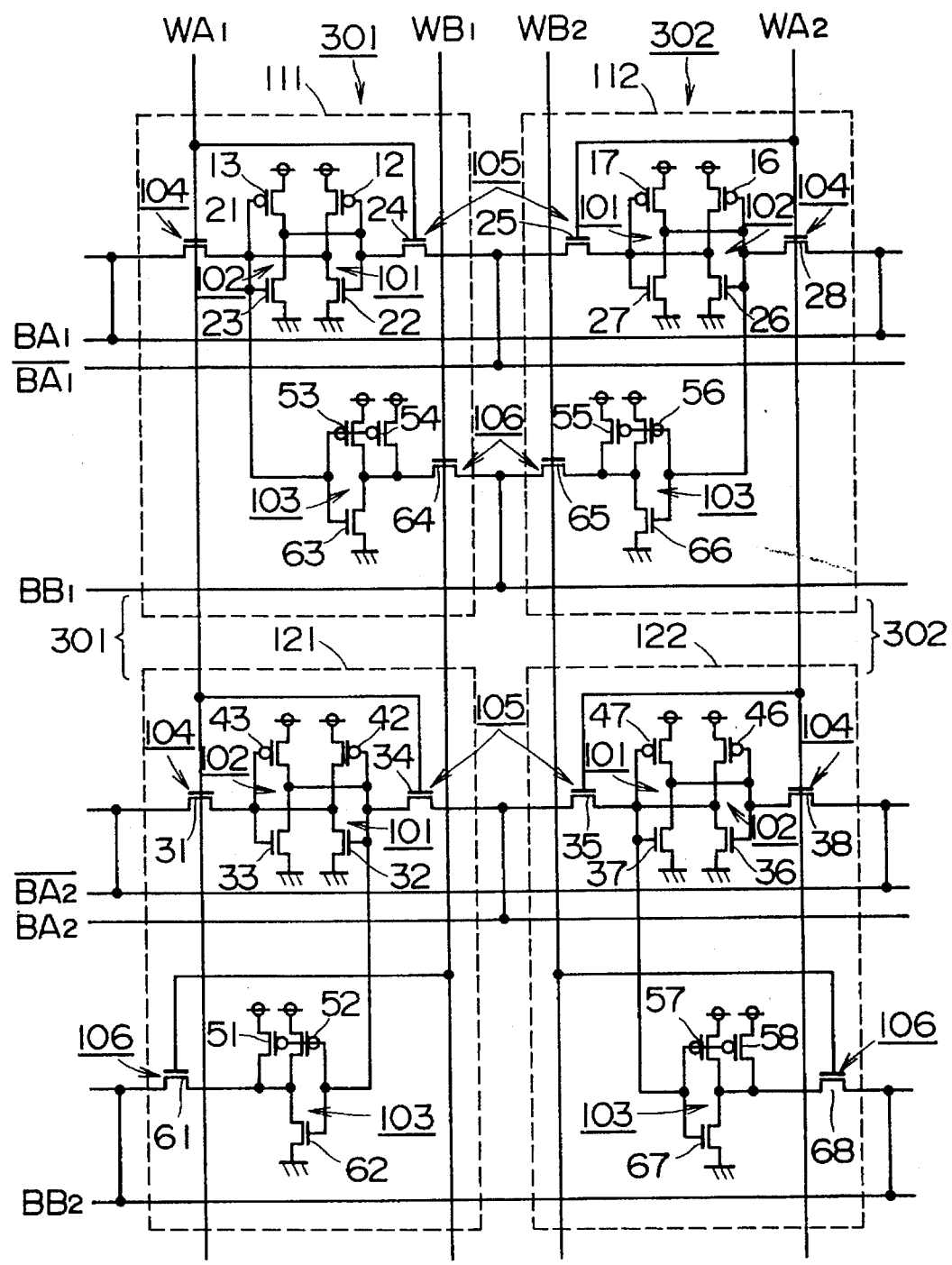
FIG. 18 is an equivalent circuit diagram of the portion of the array shown in FIG. 17.

FIG. 17 shows a memory cell array which includes a memory cell pair 301 comprising memory cells 111 and 121 shown in FIG. 15, and a memory cell pair 302 comprising memory cells 112 and 122 similar to memory cells 111 and 121. The arrangements of memory cells 112 and 122 are symmetrical with respect to those of memory cells 111 and 121, respectively. A number of such pairs as memory cell pairs 301 and 302 are arranged in the row direction. FIG. 18 is an equivalent circuit diagram of the memory cell array of FIG. 17.

In FIGS. 17 and 18, $WA_1$ and $WA_2$, and $WB_1$ and $WB_2$ are first and second word lines for the memory cells in each pair, respectively, $BA_1$ and $\overline{BA_2}$ represent first bit lines, $\overline{BA_1}$ and $BA_2$ represent second bit lines, and $BB_1$ and $BB_2$ represent third bit lines. Other reference numerals denote similar items or functions to those having the same reference numerals shown in FIG. 15.

First access gates 104 of memory cells 111 and 112 are connected to bit line $BA_1$, and second access gates 105 are connected to bit lines $\overline{BA_1}$. Third access gates 106 of memory cells 111 and 112 are connected to bit lines $BB_1$. Memory cells 121 and 122 have their first access gates 104 connected to bit line $\overline{BA_2}$, have their second access gates 105 connected to bit line $BA_2$, and have their third access gate 106 connected to $BB_2$. The gates of MOS transistors of first and second access gates 104 and 105 of memory cells 111 and 121 are connected to word line $WA_1$, and the gates of MOS transistors of third access gates 106 of memory cells 111 and 121 are connected to word line $WB_1$. On the other hand, the gates of MOS transistors of first and second access gates 104 and 105 of memory cells 112 and 122 are connected to word line $WA_2$, and the gates of MOS transistors of third access gates 106 of memory cells 112 and 122 are connected to word line $WB_2$.

The operation of the respective memory cells 111, 112, 121 and 122 is similar to that of memory cells 111 and 121 of FIG. 15, except that for accessing memory cell 111 or 121 of the memory cell pair 301, word lines $WA_1$ and $WB_1$ are placed at the "H" level, while, for accessing memory cell 112 or 122 of the pair 302, word lines $WA_2$ and $WB_2$ are driven to the "H" level.

The arrangement shown in FIG. 17 has an advantage that first and second inverters 101 and 102 and first and second access gates 104 and 105 of each memory cell can be disposed in such a manner as to enable efficient use of the semiconductor substrate, as in the embodiment shown in FIG. 7, and also has an advantage that third inverters 103 and third access gates 106 of the memory cells forming a pair can be disposed in such a manner as to enable efficient use of the semiconductor substrate, as in the embodiment shown in FIG. 13. Furthermore, since MOS transistors of the respective access gates of memory cells adjacent in the row direction are connected to a common bit line, there is no need for disposing an isolating MOS transistor between the adjacent memory cells, which further increases the efficiency of utilization of the semiconductor substrate area. In addition, it makes it possible to simplify the bit line wiring and the word line wiring.

As described in detail, according to the present invention, because complementary signals are applied to a flip-flop through two bit lines for writing data into a memory cell, reliable writing operation is assured. Furthermore, there is no need for interposing any isolating MOS transistors between first, second and third inverters and first, second and third access gates, which form the memory cell. Furthermore, no isolating MOS transistors need be disposed between adjacent memory cells. Thus, the area of a semiconductor substrate can be efficiently used.

What is claimed is:

1. A memory cell array comprising:

at least a first memory cell including at least first and second pairs of rows of transistors;

each of said pairs including first and second rows having first and second conductivity types, respectively;

first, second, third and fourth transistors in said first row of said first pair;

fifth and sixth transistors in said second row of said first pair;

each of said first, second, third and fourth transistors being adjacent and sharing source/drain regions with an adjacent one of said first, second, third and fourth transistors;

each of said fifth and sixth transistors being adjacent and sharing a source/drain region;

said second and fifth transistors being connected in series between first and second reference voltages to form a first inverter;

said third and sixth transistors being connected in series between said first and second reference voltages to form a second inverter;

an input of said first inverter being connected to an output of said second inverter;

an input of said second inverter being connected to an output of said first inverter;

said first and fourth transistors having sources connected to first and second bit lines, respectively;

said first and fourth transistors having gates connected to a write word line;

said first and fourth transistors having drains connected to said input of said first inverter and said input of said second inverter, respectively;

seventh and eighth transistors in said first and second row of said second pair, respectively;

said seventh and eighth transistors being connected in series between said first and second reference voltages to form a third inverter;

an input of said third inverter being connected to said output of said second inverter; and a ninth transistor having a drain connected to an output of said third inverter, a source connected to a read out line, and a gate connected to a read word line.

2. A memory cell array according to claim 1, further comprising:

a second memory cell including a first transistor through a ninth transistor; and said first transistor of said first memory cell shares its source region with said first transistor of said second memory cell.

3. A memory cell array according to claim 2, wherein said fourth transistor of said first memory cell shares its source region with said fourth transistor of said second memory cell.

4. A memory cell array according to claim 2, wherein said ninth transistor of said first memory cell shares its drain region with said ninth transistor of said second memory cell.

5. A memory cell array according to claim 2, further comprising:

said seventh transistor of said first memory cell shares its drain region with said seventh transistor of said second memory cell; and said eighth transistor of said first memory cell shares its drain region with said eighth transistor of said second memory cell.

6. A memory cell array according to claim 1, wherein said third inverter includes a combination of a plurality of parallel transistors from said first row of said second pair and a plurality of parallel transistors from said second row of said second pair.

7. A memory cell array according to claim 2, wherein said first memory cell is symmetrical to said second memory cell.

8. A memory cell array according to claim 1, wherein said eighth and ninth transistors share a drain region.

* * * * *

UNITED STATES PATENT AND TRADEMARK OFFICE
CERTIFICATE OF CORRECTION

PATENT NO. : 5,471,420

DATED : November 28, 1995

INVENTOR(S) : Koji NII, et al

It is certified that error appears in the above-indentified patent and that said Letters Patent is hereby corrected as shown below:

Drawing Sheet 6 of 17 should be deleted to appear as per attached sheet consisting of Figure 7.

Signed and Sealed this

Twenty-fifth Day of June, 1996

Attest:

BRUCE LEHMAN

*Attesting Officer*      *Commissioner of Patents and Trademarks*